(12) United States Patent
Mauczok et al.

(10) Patent No.: US 9,889,472 B2
(45) Date of Patent: Feb. 13, 2018

(54) CMUT DEVICE AND MANUFACTURING METHOD

(71) Applicant: KONINKLIJKE PHILIPS N.V., Eindhoven (NL)

(72) Inventors: Ruediger Mauczok, Erkelenz (DE); Bout Marcelis, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/126,089

(22) PCT Filed: Mar. 9, 2015

(86) PCT No.: PCT/EP2015/054801
§ 371 (c)(1),
(2) Date: Sep. 14, 2016

(87) PCT Pub. No.: WO2015/139979
PCT Pub. Date: Sep. 24, 2015

(65) Prior Publication Data
US 2017/0080460 A1 Mar. 23, 2017

(30) Foreign Application Priority Data
Mar. 21, 2014 (EP) ................... 14161057

(51) Int. Cl.
*B06B 1/02* (2006.01)
*B81C 1/00* (2006.01)
(52) U.S. Cl.
CPC ........ *B06B 1/0292* (2013.01); *B81C 1/00428* (2013.01); *B81C 1/00476* (2013.01); *B81C 1/00547* (2013.01)

(58) Field of Classification Search
CPC .............. B06B 1/0292; B81C 1/00547; B81C 1/00428; B81C 1/00476
See application file for complete search history.

(56) References Cited

U.S. PATENT DOCUMENTS 5,591,678 A  1/1997  Bendik et al.
8,047,995 B2  11/2011  Wakabayashi et al.
(Continued)

FOREIGN PATENT DOCUMENTS

EP  0967641 A2  12/1999
EP  2508269 A2  10/2012

*Primary Examiner* — Mamadou Diallo

(57) ABSTRACT

Disclosed is a method of manufacturing a device (1) comprising a plurality of micro-machined ultrasonic transducer cells (100) in a first region (10) on a substrate (30) and a plurality of interconnects (200) in a second region (20) on said substrate, each of said cells comprising a first electrode (110) separated by a cavity (130) from a second electrode (120) supported by a membrane (140), the method comprising forming a dielectric layer stack (11, 13, 15, 17) over the substrate, said dielectric layer stack defining the respective membranes of the micro-machined ultrasonic transducers in the first region; reducing the thickness of the dielectric layer stack in the second region by partially etching away the dielectric layer stack in the second region; etching a plurality of trenches (22) in the reduced thickness portion of the dielectric layer stack, each of said trenches exposing a conductive contact (210) in the second region; and filling said trenches with a conductive material. A device manufactured in accordance with this method and an apparatus including the device are also disclosed.

15 Claims, 10 Drawing Sheets

(56) References Cited

U.S. PATENT DOCUMENTS

| | | |
|---|---|---|
| 8,309,428 B2 | 11/2012 | Lemmerhirt et al. |
| 9,067,779 B1 * | 6/2015 | Rothberg ............ B81C 1/00238 |
| 2007/0267945 A1 | 11/2007 | Sudol |
| 2009/0122651 A1 | 5/2009 | Kupnik et al. |
| 2010/0002894 A1 * | 1/2010 | Lan ........................ H04R 31/00 |
| | | 381/163 |
| 2012/0058587 A1 | 3/2012 | Chang |
| 2015/0130007 A1 * | 5/2015 | Kawamura ....... H01L 27/14623 |
| | | 257/432 |

* cited by examiner (d)

(e)

(f)

(g)

(h)

(k)

(l)

(m)

(n)

(o)

(p)

CMUT DEVICE AND MANUFACTURING METHOD

This application is the U.S. National Phase application under 35 U.S.C. § 371 of International Application No. PCT/EP2015/054801, filed on Mar. 9, 2015, which claims the benefit of European Patent Application No. 14161057.6, filed Mar. 21, 2014. These applications are hereby incorporated by reference herein.

FIELD OF THE INVENTION

The present invention relates to a method of manufacturing a CMUT device comprising a plurality of CMUT cells and a plurality of interconnects.

The present invention further relates to a CMUT device comprising a plurality of CMUT cells and a plurality of interconnects.

BACKGROUND OF THE INVENTION

Capacitive micro-machined ultrasonic transducer (CMUT) devices are rapidly gaining popularity as the sensors in a range of sensing apparatuses such as imaging apparatuses. This is because CMUT devices can offer excellent bandwidth and acoustic impedance characteristics, which makes them the preferable over e.g. piezoelectric transducers.

Vibration of the CMUT membrane can be triggered by applying pressure (for example using ultrasound) or can be induced electrically. Electrical connection to the CMUT device, often by means of an integrated circuit (IC) such as an application specific integrated circuit (ASIC) facilitates both transmission and reception modes of the device. In reception mode, changes in the membrane position cause changes in electrical capacitance, which can be registered electronically. In transmission mode, applying an electrical signal causes vibration of the membrane.

CMUT devices generally operate with a biasing voltage applied. The CMUT can be operated in so called collapsed mode where the biasing voltage applied is increased above the collapse voltage to restrict the membrane and confine part of it against the substrate. The frequency of operation of the CMUT device is characterised by the material and physical properties of the membrane, such as the stiffness, and the size of the cavity. The bias voltage and application of the CMUT device also influence the operation mode. A CMUT device is often used in apparatuses for ultrasound imaging applications and in other applications where the CMUT device is used to detect fluid or air pressures. A pressure causes a deflection of the membrane that is electronically sensed as a change of capacitance. A pressure reading can then be derived.

FIG. 1 schematically depicts a top view and FIG. 2 schematically depicts a cross-section along the line A-A' in FIG. 1 of a conventional CMUT device 1. The CMUT device comprises a plurality of CMUT cells 100 in a CMUT region 10 of the device 1 and a plurality of interconnects 200, which plurality may include routing lines 205, in an interconnect region 20 of the device 1. The boundary between the CMUT region 10 and the interconnect region 20 is indicated by the vertical dashed lines in FIG. 2. The interconnects 200 typically provide an interconnection to a conductive contact 210 such as a bond pad inside the CMUT device 1. Such conductive contacts may provide a connection to the outside world or may be used to facilitate interconnections between different elements of the CMUT device 1, e.g. between different CMUT cells 100, between a CMUT cell 100 and a signal processing element, and so on.

Each CMUT cell 100 typically comprises a first electrode 110 separated from a second electrode 120 by a cavity 130. The second electrode 120 is typically embedded in a membrane 140 made of one or more electrically insulating or dielectric layers. In some designs, the second electrode 120 is embedded in the membrane 140, i.e. sandwiched in between a relatively thin dielectric layer portion 142 and a relatively thick dielectric layer portion 144 from the cavity 130 to prevent a short circuit between the first electrode 110 and the second electrode 120 upon deformation of the membrane 140 including the second electrode 120 towards the first electrode 110.

Conventional CMUT designs have membrane 140 layer thicknesses in the order of 1-2 micron, which can be processed with common fabrication methods such as plasma-enhanced chemical vapour deposition (PECVD). However, where the CMUT cells 100 are required to operate at a low frequency, the membrane diameter D may need to be in excess of 100 micron, which can result in the thickness of the membrane 140 becoming larger than 3 micron. Consequently, the overall thickness of the dielectric layer stack in the interconnect region 20 on top of the conductive contacts 210, e.g. bond pads, may exceed 6 micron. This overall thickness may further increase, for instance when the substrate 30 on which the CMUT cells 100 comprises planarization and/or encapsulation layers, with the conductive contacts 210, e.g. bond pads, being formed underneath these additional layers, e.g. in the top metallization layer of a metallization stack. Such additional layers can add another 2-3 micron to the overall thickness of the dielectric layer stack.

In order to make an electrical connection to the CMUT and ASIC electrodes, the conductive contacts 210 are provided in the interconnect region 20 of the CMUT device 1, which region for instance may be located at the perimeter of the die. The conductive contacts 210 are typically made of a conductive material, for instance a metal such as aluminium, and are initially covered by the electrically insulating layers of the dielectric layer stack. To allow electrical connection to the conductive contacts 210, the conductive contacts 210 are typically etched open in one of the final phases of CMUT fabrication to form trenches 22, which trenches 22 are subsequently lined or filled with a metal interconnect 200.

However, the opening of the conductive contacts 210 in the interconnect region 20 of the CMUT devices 1 can become challenging if the overall thickness of the dielectric layer stack covering the conductive contacts 210 becomes too large, i.e. more than 2 micron. This typically requires an increase in the required etching time in order to etch through such thick dielectric layers. However, the maximum allowable etching time may be limited by selectivity and resist consumption issues. These conflicting requirements may make it impossible to fabricate CMUT devices 1 with thick membrane layers 140 in a conventional way.

A further challenge is that metallization of the conductive contacts 210 with thick metal interconnects 200 may become a challenge if the aspect ratio, i.e. the height H over the width W of the metal interconnects 200, becomes unfavourable. This is especially important if the metal interconnects 200 are used for I/O routing, as such routing needs to carry high currents, and therefore needs to be implemented with a relatively thick metal interconnect 200 to reduce resistivity. For such I/O routing, conductive contacts 210 and the metal interconnects 200 require a lowresistive electrical connection between each other. This therefore requires the trenches in which the metal interconnects are to be formed to be effectively lined or filled with the metal. However, such an effective lining or filling can be challenging for trenches having steep and deep sidewalls, i.e. having high aspect ratios.

Consequently, the manufacturing of CMUT devices that meet design specifications is a non-trivial exercise. In order to obtain cost-effective devices, it is for instance desirable to manufacture the CMUT devices in existing manufacturing technologies. CMOS is a non-limiting example of such a technology. U.S. Pat. No. 8,309,428 B2 for instance discloses a CMOS manufacturing method of such a device.

However, it proves to be difficult to obtain high yields of acceptable CMUT devices from wafers manufactured in such technologies, in particular when the individual CMUT cells have a relatively large diameter, such as diameters in excess of 100 microns, which for instance is required when the CMUT device is to be operated in a low-frequency mode.

SUMMARY OF THE INVENTION

The present invention seeks to provide a method of manufacturing a CMUT device comprising a plurality of CMUT cells and a plurality of interconnects that can produce such CMUT devices at good yields.

The present invention further seeks to provide such a CMUT device.

According to an aspect, there is provided a method of manufacturing a device comprising a plurality of micro-machined ultrasonic transducer cells in a first region on a substrate and a plurality of interconnects in a second region on said substrate the method comprising forming a dielectric layer stack over the substrate, said dielectric layer stack defining respective membranes of the micro-machined ultrasonic transducers in the first region; reducing the thickness of the dielectric layer stack in the second region by partially etching away the dielectric layer stack in the second region; etching a plurality of trenches in the reduced thickness portion of the dielectric layer stack, each of said trenches exposing a conductive contact in the second region; and lining or filling said trenches with a conductive material.

By reducing the height of the dielectric layer stack over the second region prior to the formation of the interconnects to the conductive contacts such as bond pads through this section of the dielectric layer stack, the aspect ratio (H/W) of the trenches in which the interconnects are to be formed is reduced, thereby mitigating the problems with effectively filling these trenches with the conductive material. This therefore improves the quality of interconnects, i.e. avoids resistance increases in the interconnects that are the result of partial lining or filling of the trenches only, and consequentially improves the yield of the manufacturing process due to the fact that fewer devices have to be rejected because of insufficient quality interconnects.

The etching step in which the thickness of the dielectric layer stack in the second region is reduced may be performed in any suitable manner, such as by depositing a resist layer over the dielectric layer stack developing the resist layer through a lithographic mask and removing the resist from said second region to facilitate selective removal of a part of the second region without affecting the first region because of the resist protection over the first region.

Alternatively, the step of reducing the thickness of the dielectric layer stack in the second region may comprise depositing a hard mask, e.g. a metal layer, over the dielectric layer stack and patterning the hard mask to expose the second region.

In order to improve the control over the etching step in which the dielectric layer stack is partially removed from the second region, the step of forming a dielectric layer stack over the substrate may further include forming an etch stop layer in said stack in the second region; and the step of partially etching away the dielectric layer stack in the second region may comprise terminating said etching step on the etch stop layer.

The etch stop layer may be removed prior to etching said plurality of trenches, for instance to further reduce the aspect ratio of the trenches to be formed.

In an example embodiment, the CMUT cells may be formed by forming a plurality of first electrodes in said first region on said substrate; forming a sacrificial material layer portion over each of the first electrodes; forming a first dielectric layer of the dielectric layer stack over the sacrificial material layer portions; forming a respective second electrode on the first dielectric layer over each of the sacrificial material layer portions; covering the resultant structure by at least one further dielectric layer of the dielectric layer stack; creating a plurality of openings in the first dielectric layer and the at least one further dielectric layer, each opening providing access to one of said sacrificial material portions; removing the sacrificial material portions through said openings; and forming at least a second further dielectric layer of the dielectric layer stack on the first dielectric layer, said second further dielectric layer sealing said openings.

The step of forming said plurality of first electrodes may comprise depositing a first metal layer on said substrate and patterning the first metal layer, said patterning step further comprising forming the conductive contacts in said second region.

The step of forming said second electrodes may comprise depositing a second metal layer on said first dielectric layer and patterning the second metal layer, said patterning step further comprising forming the conductive contacts in said second region.

The substrate may carry at least one of a planarization stack and a passivation stack, wherein the conductive contacts are located below the planarization stack and/or passivation stack.

Each membrane may have a diameter of at least 100 micron such that the CMUT cells are suitable for use at low frequencies. In this embodiment, each membrane as defined by part of the dielectric layer stack preferably has a thickness of at least 3 micron.

According to another aspect, there is provided a device comprising a plurality of micro-machined ultrasonic transducer cells in a first region on a substrate, and a plurality of interconnects in a second region on said substrate for providing connections to respective bond pads on the substrate, the device further comprising a dielectric layer stack over said substrate defining the respective membranes of the micro-machined ultrasonic transducer cells in said first region, wherein the plurality of interconnects extend through said dielectric layer stack in said second region, a portion of said dielectric layer stack being removed from the second region such that the dielectric layer stack having has a stepped profile in which said stack is recessed in said second region.

As previously explained, the provision of such a device having a stepped profile in the dielectric layer stack, i.e. the dielectric layer stack has a reduced thickness in the second region comprising the interconnects facilitates the generation of sufficient quality interconnects due to the reduced aspect ratio of the trenches in which the interconnects are formed. This improves the yield of the device manufacturing process and reduces the cost of the individual devices.

In an embodiment, said stack is recessed by at least 2 micron in said second region to significantly reduce the aspect ratio of the trenches.

Each of the membranes may have a diameter of at least 100 micron and optionally have a thickness of at least 3 micron in order to facilitate use of the device at low frequencies.

The second region may be a peripheral region of the device, for instance the peripheral region of a wafer or a die, which peripheral region envelopes the first region.

In an example embodiment, each micro-machined ultrasonic transducer cell comprises a first electrode separated from a second electrode by a cavity, and wherein each second electrode is embedded in the membrane such that the second electrode is separated from the cavity by a first dielectric layer of said dielectric layer stack and the membrane further comprises at least one further dielectric layer of the dielectric layer stack on the second electrode, wherein the at least one further dielectric layer is thicker than the first dielectric layer. It has been found that this arrangement yields CMUT cells having membranes that are resistant to buckling during the release of the cavity, thereby further improving the yield of the manufacturing process and consequently reducing the cost of the device.

In accordance with yet another aspect, there is provided an apparatus comprising the device according to an embodiment of the present invention. Such an apparatus may for instance be an ultrasound imaging device or a pressure sensing device.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
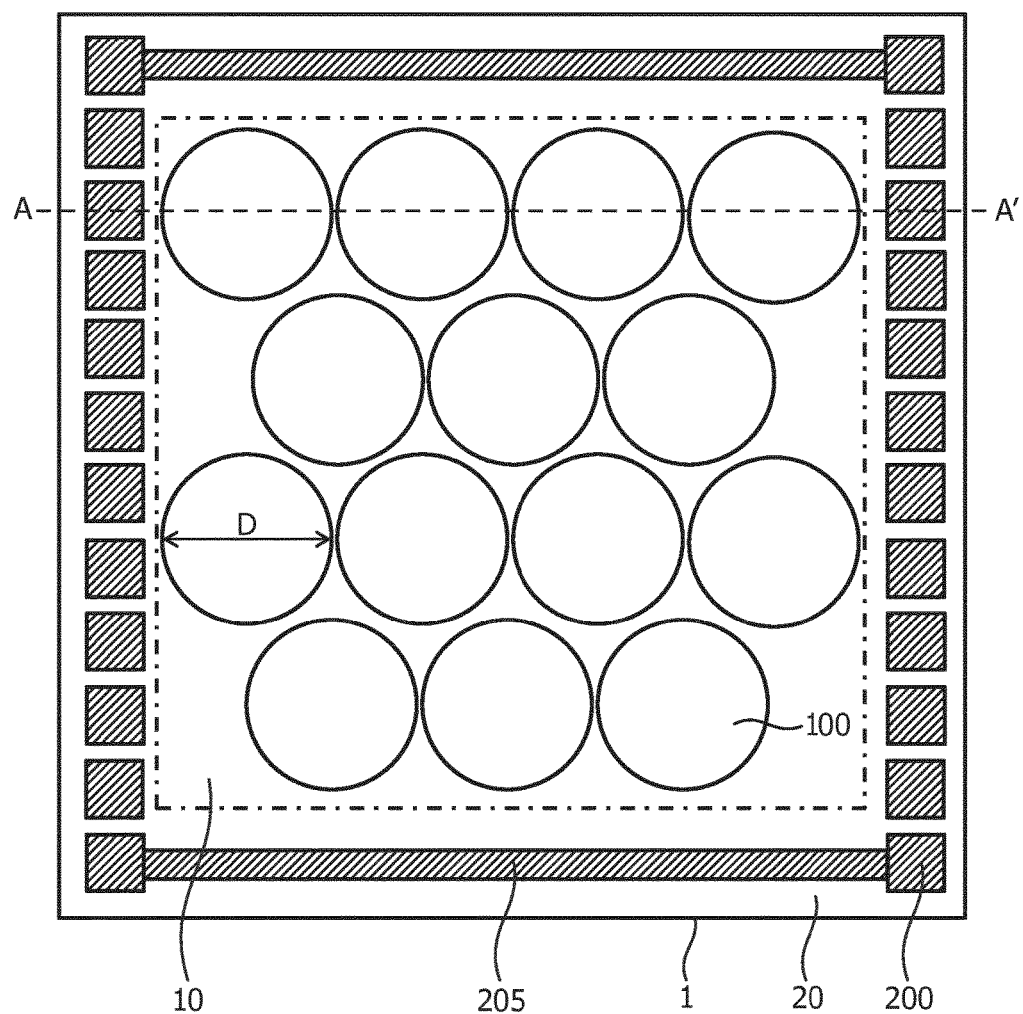
FIG. 1 schematically depicts a top view of a prior art CMUT device.

It should be understood that the Figures are merely schematic and are not drawn to scale. It should also be understood that the same reference numerals are used throughout the Figures to indicate the same or similar parts.

In the context of the description and claims of the present application, where a layered structure is described, it should be understood that where a first layer is described as being on or over a second layer, this is intended to include embodiments in which the first layer is directly on, i.e. in contact with, the second layer as well as embodiments in which one or more intermediate layers are present in between the first layer and the second layer. Similarly, where the present application described a method of manufacturing such a layered structure, it should be understood that where a first layer is formed on or over a second layer, this may mean that the first layer is formed directly on or over the second layer, i.e. in contact therewith, or may mean that one or more intermediate layers are formed on the second layer prior to the formation of the first layer thereon or over.

Figure 2:
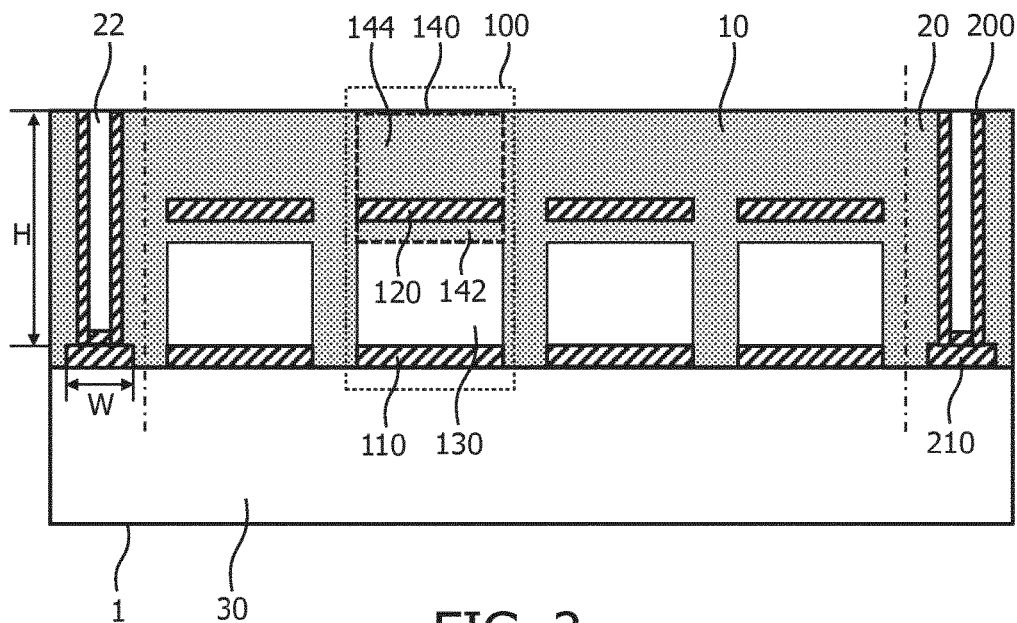
FIG. 2 schematically depicts a cross-section of a prior art CMUT device along the line A-A' in FIG. 1.
Figure 3:
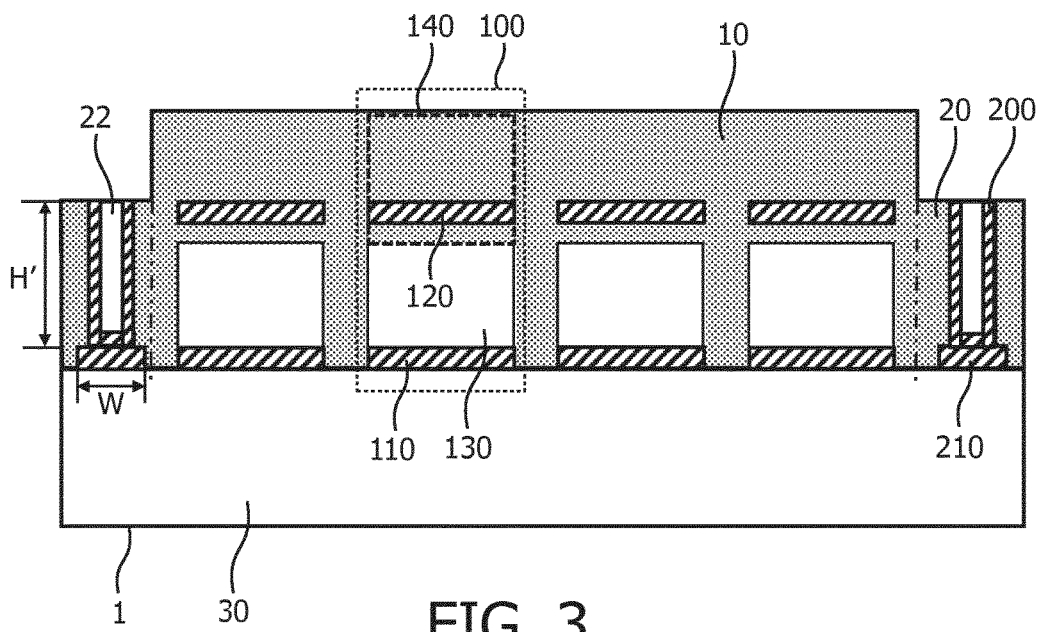
FIG. 3 schematically depicts a cross-section of a CMUT device according to an embodiment of the present invention.

FIG. 3 schematically depicts a cross-section of a device 1 comprising a plurality of CMUT cells 100 according to an embodiment of the present invention, in which the prior art device as shown in FIG. 2 has been altered as follows. Compared to the prior art device shown in FIG. 2, the device 1 of the present invention comprises a stepped dielectric layer stack. The stepped dielectric layer stack comprises two steps; an upper step in a first region 10 of the dielectric layer stack and a lower step in a second region 20 of the dielectric layer stack. The first region 10 corresponds to the region in which the membranes 140 of the various CMUT cells 100 are located and the second region 20 corresponds to the region in which interconnects 200 to the conductive contacts 210 such as bond pads are located. The first region 10 will also be referred to as the CMUT region and the second region 20 will also be referred to as the interconnect region.

The partial removal of the dielectric layer stack in the second region 20 reduces the height of the dielectric layer stack in the second region 20 a height H'. Consequently, the aspect ratio of interconnects 200 in the trenches 22 reduces to H'/W. In at least some embodiments, H' is at least 2 micron, e.g. about 3 micron, smaller than H, wherein H is the maximum thickness of the dielectric layer stack as for instance is shown in FIG. 2. This therefore facilitates a more effective lining or filling of the trenches 22 through the dielectric layer stack in the region 20 that expose the conductive contacts 210 such as bond pads with a suitable metal to form interconnects 200. Consequently, the reduced aspect ratio of these trenches facilitates the formation of interconnects 200 having excellent conductive properties and reduces the risk of the formation of interconnects 200 that suffer from high resistivity caused by partial lining or filling only of these trenches 22. This therefore facilitates the formation of CMUT membranes 140 having relatively high thicknesses, e.g. thicknesses in excess of 3 micron, without complicating the formation of interconnects 200 due to increased aspect ratios resulting from such relatively thick CMUT membranes 140.

At this point it is noted that the interconnects 200 may provide any suitable interconnection. Non-limiting examples of such interconnections include the provision of an external contact to a CMUT cell 100 or to another circuit in or on the substrate 10, in which case the conductive contact 210 may be implemented as a bond pad, an I/O routing connection between one or more CMUT cells 100 and one or more external bond pad(s), an I/O routing connection to other CMUT cells or to a metal layer of a metallization stack on the substrate 30 below the CMUT cells 100, and so on.

Figure 4:
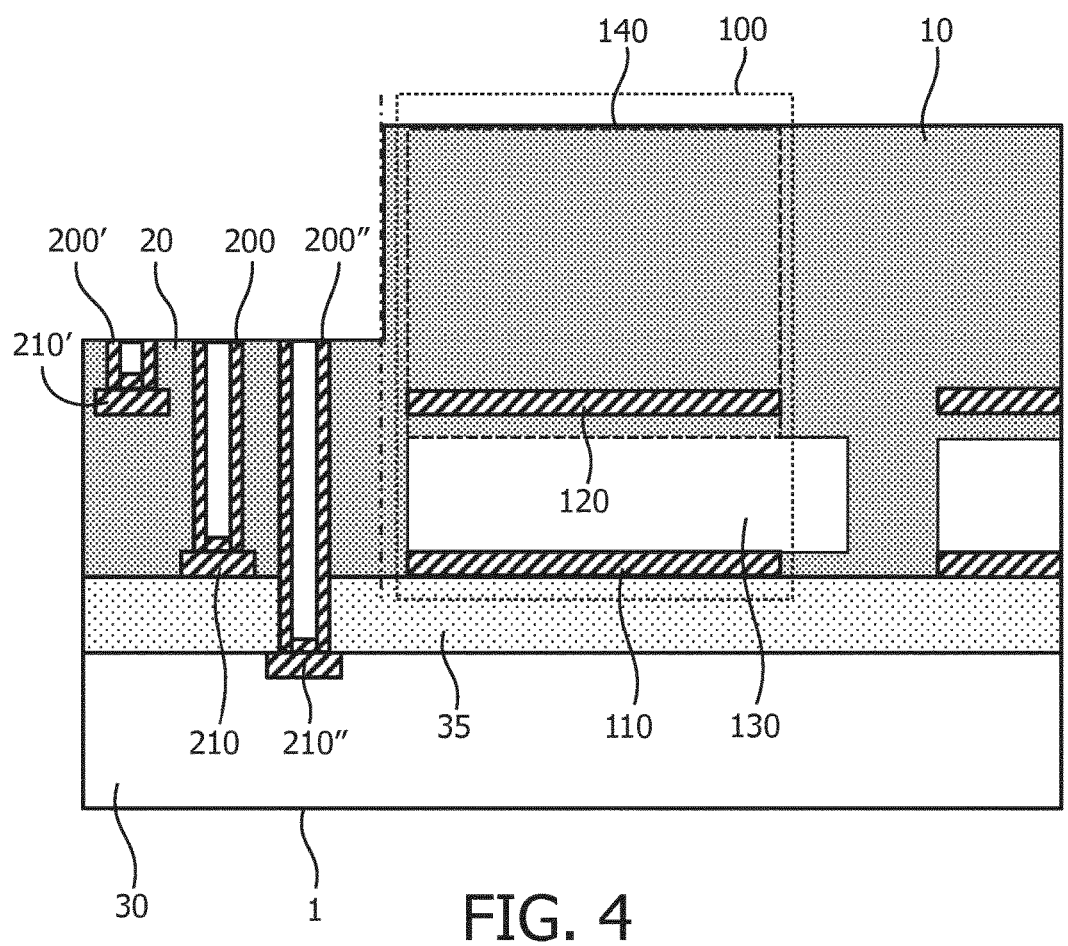
FIG. 4 schematically depicts a cross-section of various aspects of a CMUT device according to alternative embodiments of the present invention.

In FIG. 3, the conductive contact 210 is shown as forming part of the metallization layer from which the first electrodes 110 of the CMUT cells 100 have been formed, e.g. by patterning a deposited metallization layer as will be explained in more detail later. However, it should be understood that this location of the conductive contacts 210 is by way of non-limiting example only. The conductive contacts 210 may be located in any suitable location, a few non-limiting examples of which are shown in FIG. 4, which schematically depicts a cross-section of a section of a device 1 in which conductive contacts 210, 210' and 210" are shown in three different suitable locations. Each conductive contact is connected to a respective interconnect 200, 200' and 200".

As previously explained, the conductive contact 210 may be formed in the metallization layer of the first electrode 110. It is however equally feasible to form conductive contact 210' in the metallization layer of the second electrode 120 or to form conductive contact 210" in an upper metallization layer of the metallization stack (not shown) below the layer stack 35 carried by the substrate 30. The layer stack 35 may be a passivation stack and/or a planarization stack, e.g. of an IC such as an ASIC formed in and on the substrate 30. It is noted that the trenches to expose the respective conductive contacts 210, 210' and 210" may be formed by sub-trenches in some embodiments. In particular, in case of the conductive contact 210" below the passivation and/or planarization stack of the device, the interconnect 200" may comprise a first portion formed in a trench 22 extending to the layer stack 35 and a second portion, for example formed in a separate processing step, extending through the layer stack 35, as will be explained in more detail below.

In case of the conductive contacts 210, 210' being located above the layer stack 35, further interconnects extending from these conductive contacts through the layer stack 35 and connecting conductive contacts 210, 210' to the metallization stack on the substrate 30 may be present as will be apparent to the person skilled in the art. Such additional interconnects for instance would allow for the signals generated by the CMUT cells 100 to be processed by circuit elements (not shown) on the substrate 30, e.g. in the case of the substrate 30 forming part of an ASIC.

It is noted for the avoidance of doubt that the conductive contacts, e.g. bond pads, provide contacts to the various parts of the device 1, such as to the respective first electrodes 110 and the respective second electrodes 120 such that the signals generated by these electrodes can be processed either by circuitry on- or off-chip. This function of such conductive contacts is of course well-known to the skilled person and will not be explained in further detail for the sake of brevity only.

Figure 5:
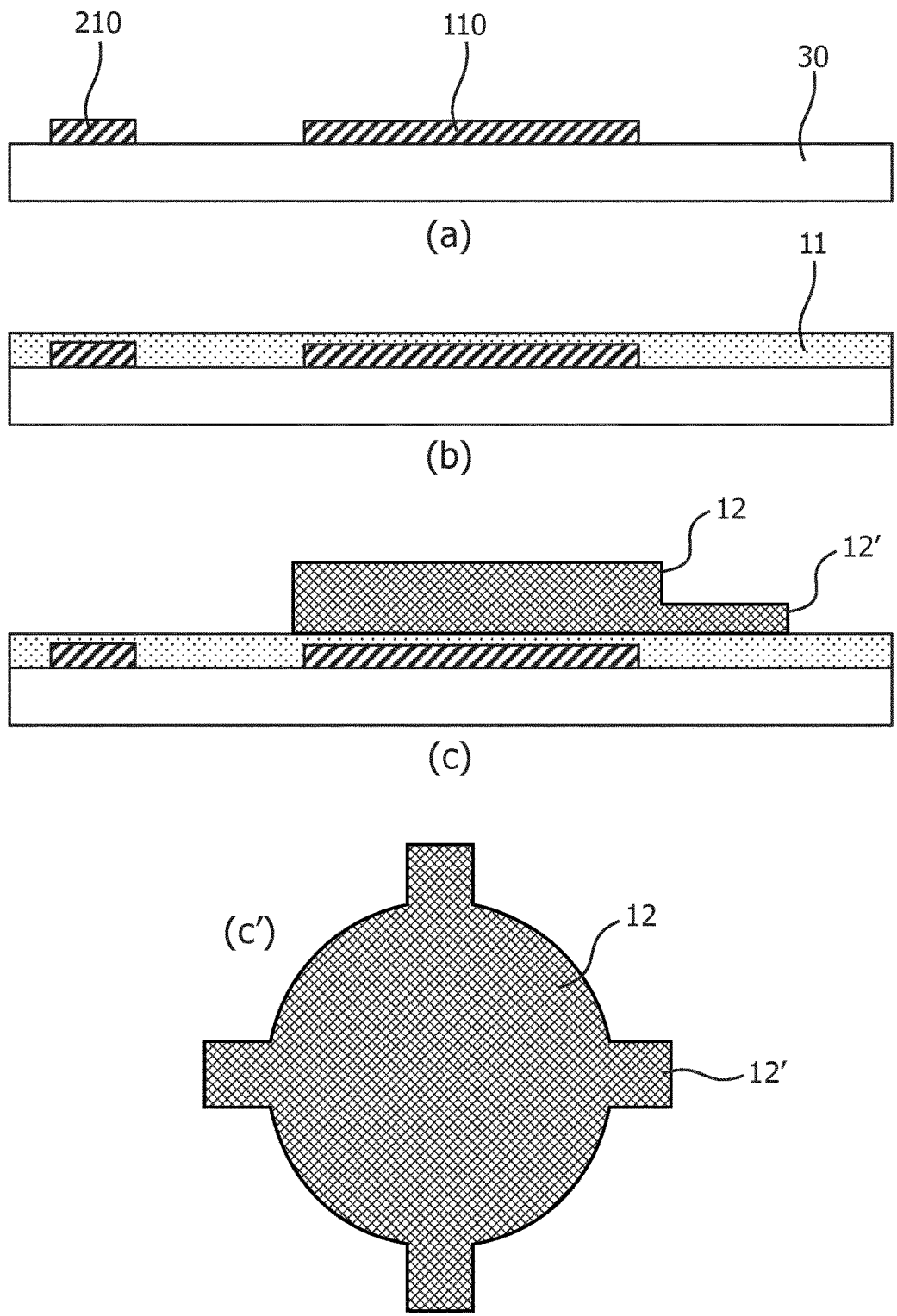
FIG. 5 schematically depicts a method of manufacturing a CMUT device according to an embodiment of the present invention.
Figure 5:
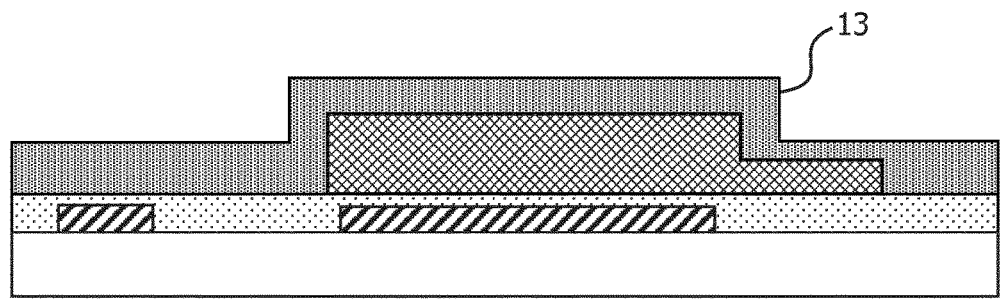
Figure 5:
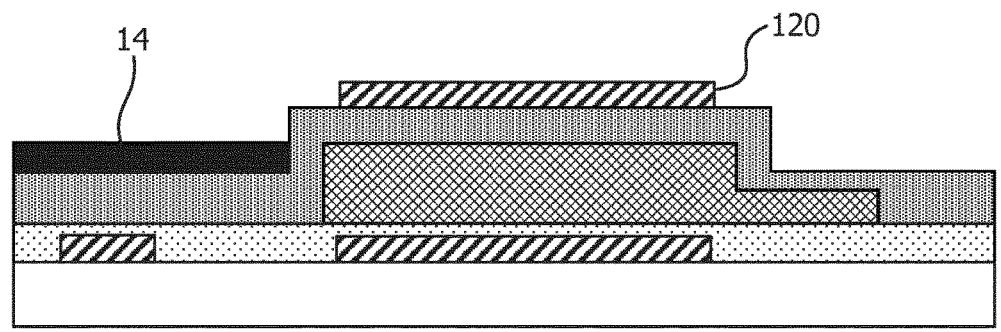
Figure 5:
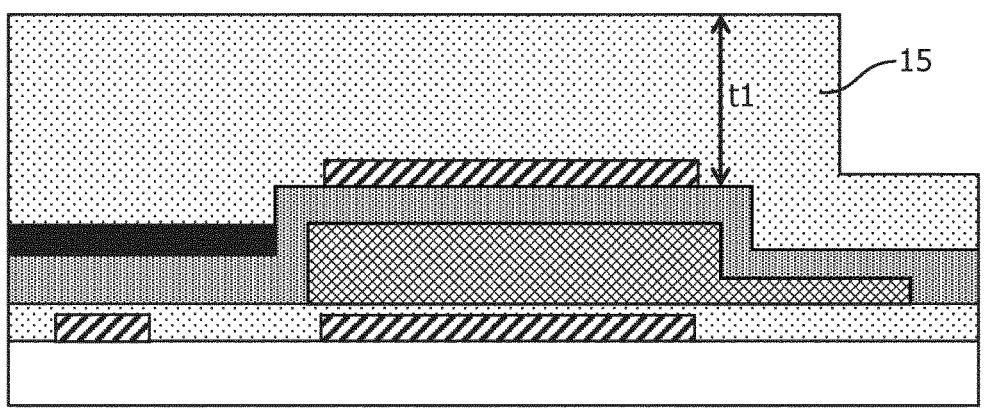
Figure 5:
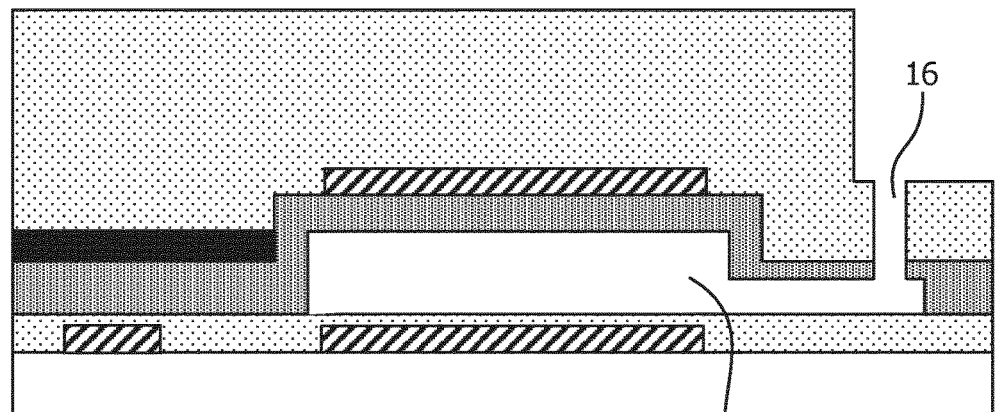
Figure 5:
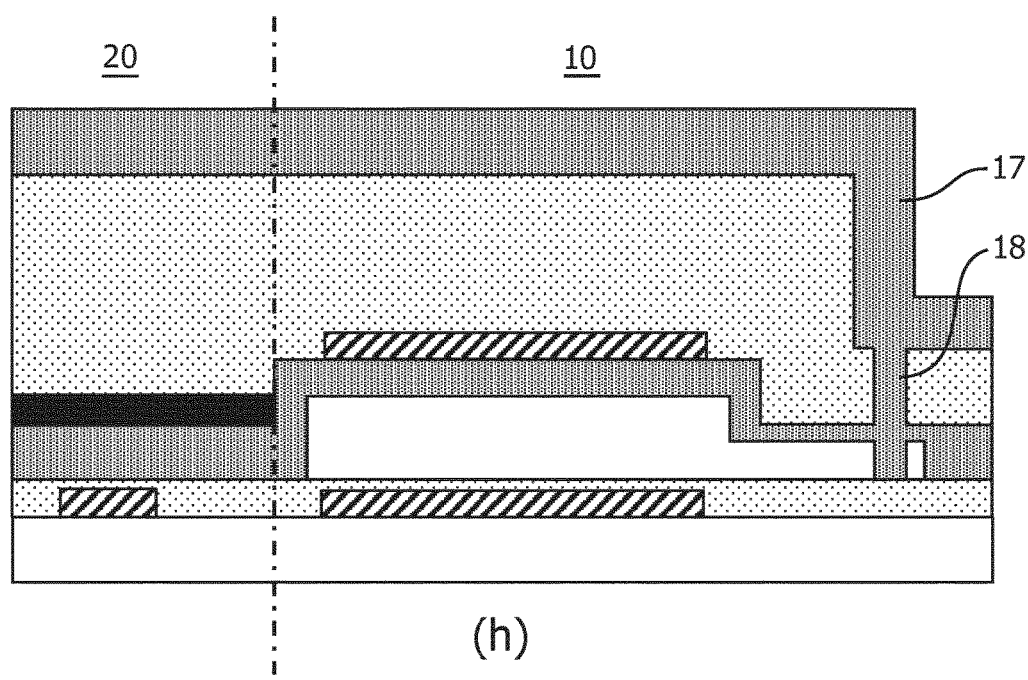
Figure 5:
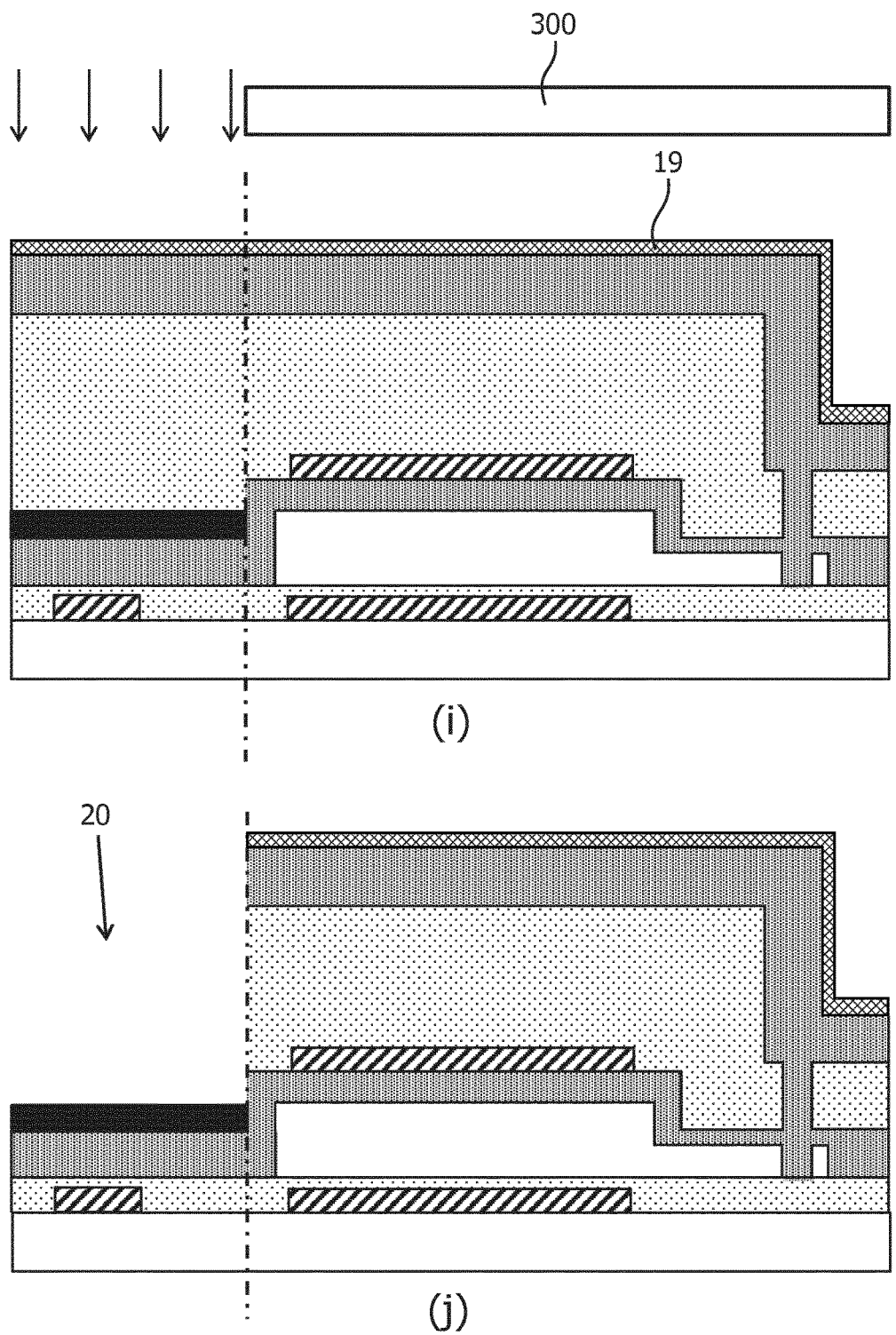
Figure 5:
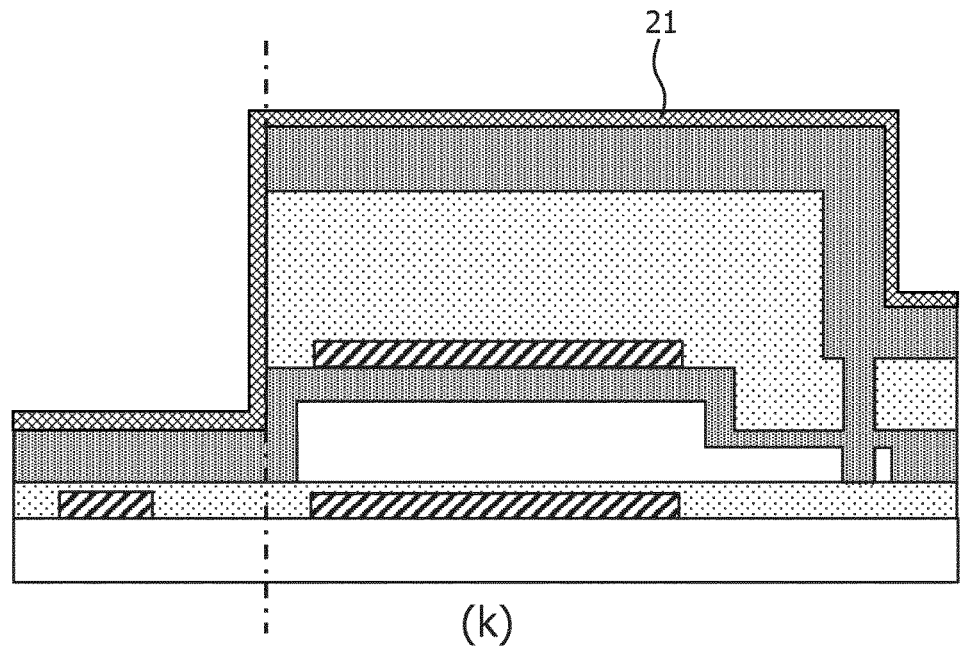
Figure 5:
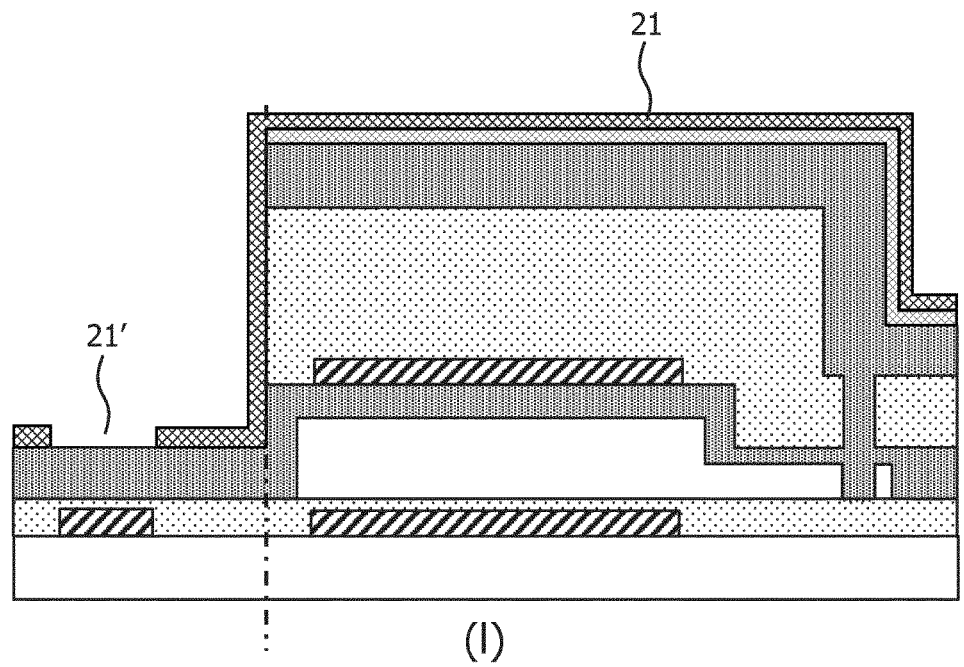
Figure 5:
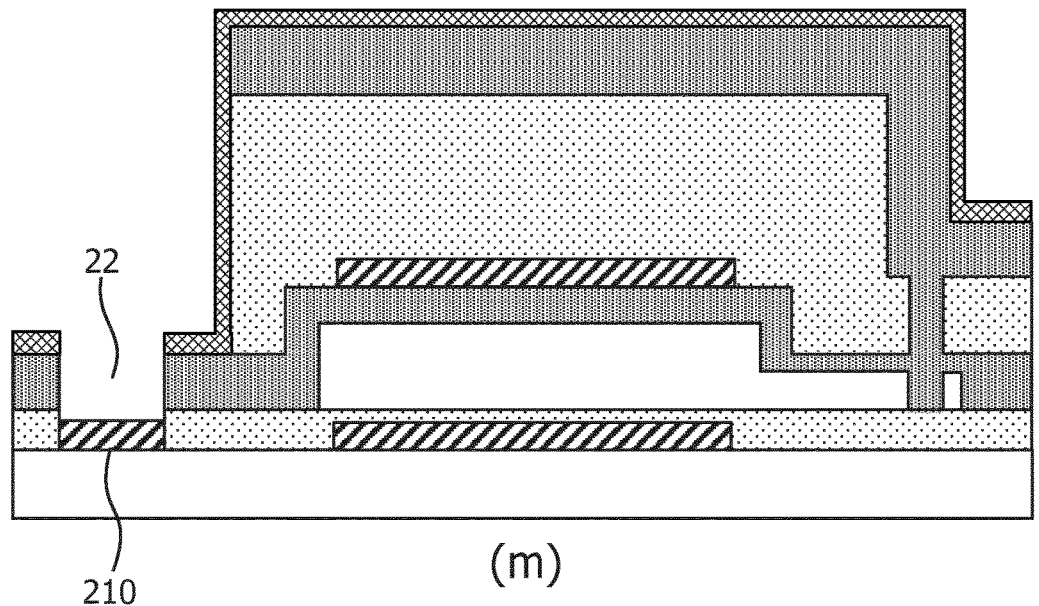
Figure 5:
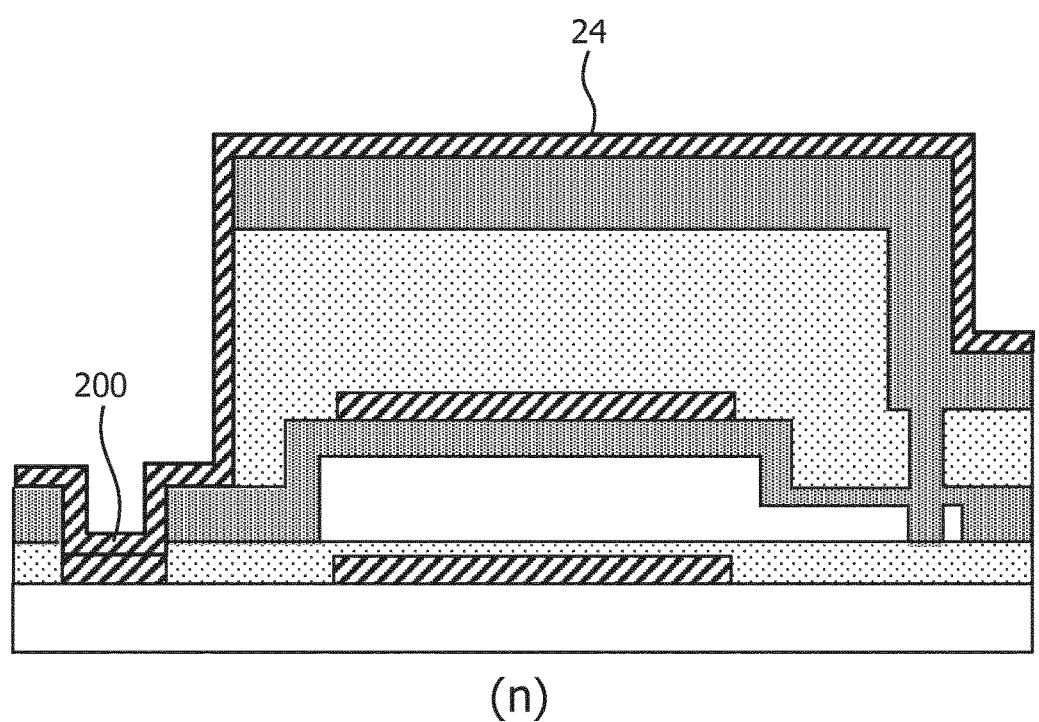
Figure 5:
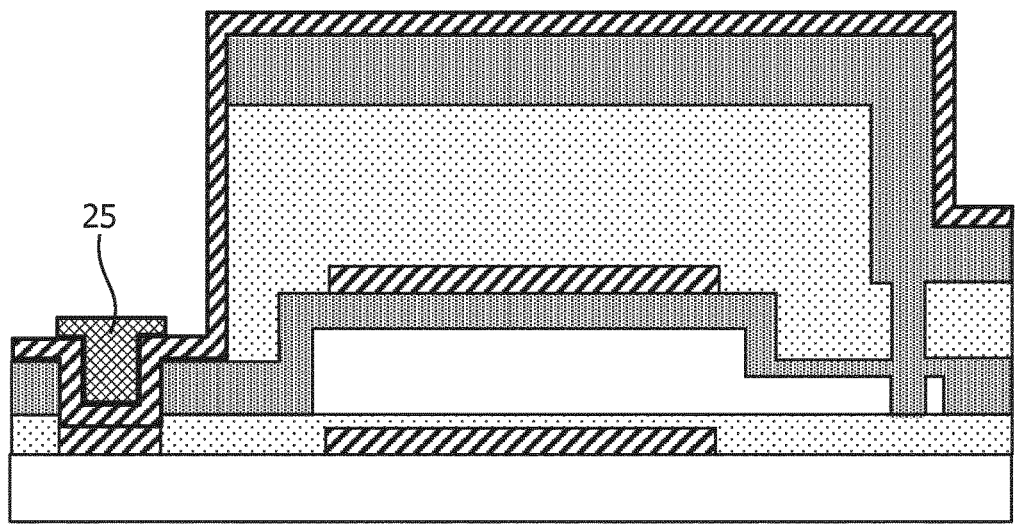
Figure 5:
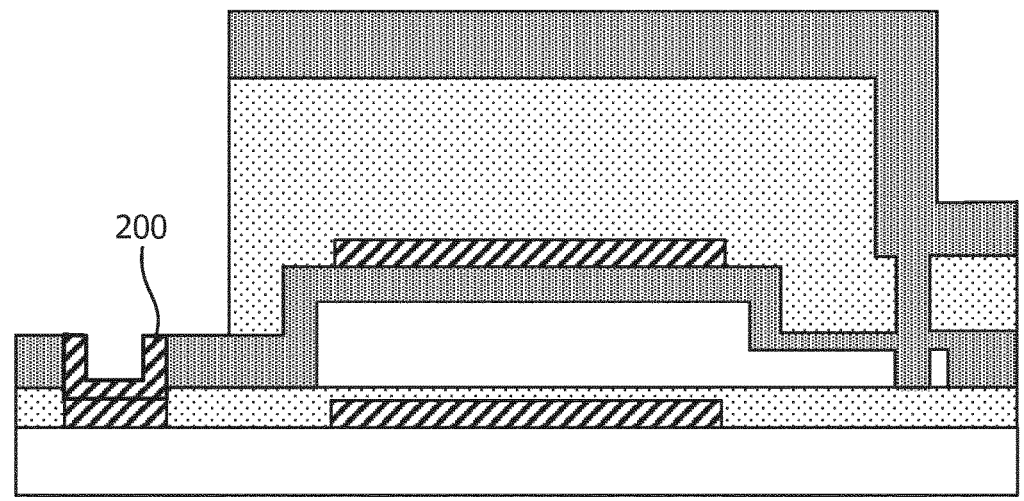

FIG. 5 schematically depicts an embodiment of a CMUT manufacturing method including processing steps for reducing the height of the interconnect region 20 of the CMUT device as explained above. The method proceeds in step (a) with the provision of a substrate 30, which may be any suitable substrate such as a silicon substrate, a silicon-on-insulator substrate, a silicon germanium substrate, a gallium nitride substrate and so on. A silicon-based substrate may for instance be used in a CMOS manufacturing process. The substrate 30 may comprise several structures, such as semiconductor devices, a metallization stack interconnecting the semiconductor devices and/or the CMUT cells, a passivation stack 35 over the metallization stack and so on. The substrate 30 may for instance be the substrate of an application specific integrated circuit (ASIC) including the CMUT cells 100 on its layer stack 35, e.g. passivation and/or planarization stack, wherein the CMUT cells 100 may be connected to signal processing circuitry on the substrate 30 by the metallization stack. The provision of such substrates 30 is well-known per se and belongs to the routine skills of the skilled artisan such that the provision of suitable substrates 30 will not be discussed in further detail for the sake of brevity only.

A first electrode 110 is formed on the substrate 30, which electrode may be formed from any suitable electrically conductive material, e.g. metals or metal alloys, doped semiconductor materials such as doped poly-silicon, (semi) conducting oxides and so on. It is for instance particularly advantageous to use metals that are readily available in the manufacturing technology of choice, as this requires minimal redesign of the manufacturing flow, which is attractive from a cost perspective. For example, in a CMOS process, conductive materials such as Al, W, Cu, Ti, TiN and so on, as well as combinations of such materials, may be used to form the first electrode 110. As the formation of such an electrode is well-known per se, this will not be explained in further detail for the sake of brevity.

At the same time, a conductive contact 210 may be formed on the substrate 30, which may be made of the same material as the first electrode 110, e.g. by patterning a deposited metal or metal alloy layer to form the one or more first electrodes 110 and one or more bond pads. It is reiterated that the conductive contact 210 is not necessarily a bond pad but may take any suitable shape, e.g. if the conductive contact 210 is to provide a contact for (internal) I/O routing purposes as previously mentioned. The formation of the conductive contact 210 may be omitted from this step if the bond pad 210 is to be provided in a different layer as also shown in FIG. 4, e.g. in a top layer of a metallization stack (not shown) of the substrate 30, in the layer defining the second electrode 120 as will be explained in more detail later, and so on.

The first electrode 110, the (optional) conductive contact 210 and the substrate 30 may subsequently optionally be covered by an electrically insulating material layer 11. This is shown in step (b). Electrically insulating layers will also be referred to as dielectric layers in the present application. Such a dielectric layer 11 for instance may be used to electrically insulate the first electrode 110 from its counter electrode (see below) to prevent short-circuits between the electrodes during the operation of the CMUT device. In addition, the dielectric layer 11 may be used to protect the first electrode 110 and the substrate 30 from damage during the removal of the sacrificial material to form the cavity over the first electrode 110.

Although the dielectric layer 11 is shown to cover the entire substrate surface 30, it is equally feasible to provide a patterned dielectric layer 11 in which only certain parts of the substrate 30 together with the first electrode 110 are covered by the dielectric layer 11. Any suitable dielectric material may be used for the protection of the first electrode 110 and the substrate 30, e.g. one or more materials selected from silicon nitride ($Si_3N_4$), silicon oxide ($SiO_2$) or the like, although it is emphasized that the suitable dielectric materials are not limited to these example materials. As such a dielectric layer 11 may be formed in any suitable manner, e.g. using suitable deposition techniques such as CVD and PECVD, its formation will not be explained in further detail for the sake of brevity.

In step (c), a sacrificial material is formed, e.g. through a suitable deposition technique, on the dielectric layer 11. The sacrificial material is patterned to form a first portion 12 from which the cavity is formed and may further comprise a second portion 12' acting as a channel through which the sacrificial material is removed.

The height of the first portion 12 and the second portion 12' of the sacrificial material corresponding to the gap height of the cavity to be formed is typically in the range of 100-1000 nm although it should be understood that values outside this range may also be contemplated.

In an embodiment, the first portion 12 is deposited as a circular portion having a few teeth-like protrusions as the second portion 12', e.g. 2-8 of such protrusions. A top-view of such a sacrificial material portion is shown in step (c'), in which four of such protrusions are shown by way of non-limiting example only. The teeth-like second portions 12' are typically used as cavity access platforms outside the membrane to be formed through which access to the first portion 12 can be provided for opening or releasing the cavity. It should be understood that the first portion 12 and the second portion 12' are typically formed to the same thickness or height, with the membrane to be formed extending towards the substrate 30 in between the teeth-like second portions 12'. In the various drawings of the present application, the second portions 12' are shown to have a different thickness in order to indicate this aspect, i.e. the aspect that the membrane of the CMUT device extends towards the substrate 30 in between the teeth-like second portions 12'. This should not be construed as the first portion 12 and the second portion 12' having different thicknesses in reality.

In principle, any suitable sacrificial material may be used, although for device performance reasons it is preferable to use sacrificial materials that can be effectively removed in a subsequent etching step. For instance, the use of metals such as Al, Cr and Mo or non-metals such as amorphous silicon or silicon oxide may be contemplated. Materials such as Al, amorphous silicon and silicon oxide are for instance readily available in CMOS processes, and of these materials Al can be particularly effectively removed by etching. The patterned sacrificial material may be formed in any suitable manner, e.g. using suitable deposition and patterning techniques and its formation will not be explained in further detail for the sake of brevity.

It will be understood that the diameter of the first portion 12 defines the diameter of the cavity of the CMUT device to be formed. In an embodiment, the diameter is selected in a range of 20-500 micron, more preferably in a range of 50-300 micron, although it should be understood that larger diameters may also be contemplated, e.g. diameters up to 1,000 micron.

In step (d), a first dielectric layer 13 of the membrane to be formed is deposited over the first portion 12 and the second portion 12' of the sacrificial material and the exposed portions of the dielectric layer 11. As the first dielectric layer 13 and the dielectric layer 11 are both exposed to the etch recipe for removing the sacrificial layer, the first dielectric layer 13 and the dielectric layer 11 may be of the same material, although it is of course also plausible to use different materials for the first dielectric layer 13 and the dielectric layer 11 respectively. In an embodiment, the first dielectric layer 13 and the dielectric layer 11 each comprise at least one layer formed of any suitable dielectric material, such as a silicon oxide layer, e.g., $SiO_2$, a silicon nitride layer, e.g., $Si_3N_4$ or the like. Many other suitable dielectric layer materials will be apparent to the skilled person. The first dielectric layer 13 may be formed as a layer stack, e.g. an oxide-nitride stack or an oxide-nitride-oxide stack. Similarly, the dielectric layer 11 may be formed as such a stack. It is reiterated that any suitable dielectric material may be used for the dielectric layer 11 and the first dielectric layer 13.

After the formation of the first dielectric layer 13, an etch stop layer 14 may be formed in the interconnect region 20 over the bond pad 210 to facilitate the reduction of the thickness of the dielectric stack in the interconnect region 20 as will be explained in more detail later. Any suitable etch stop material such as silicon nitride or a suitable metal may be selected. As will be apparent to the skilled person, the etch stop layer preferably can be selectively removed relative to the underlying first dielectric layer 13 at a later stage in the manufacturing process. If the etch stop layer 14 has to be removed at a later stage, a material should therefore be selected for the etch stop layer 14 that can be selectively removed without significantly affecting the underlying first dielectric layer 13.

The purpose of the etch stop layer 14 is to provide a well-defined point over the bond pads 210 at which an etch process to reduce the thickness of the dielectric stack in the interconnect region 20 can be terminated in order to reduce the thickness of the dielectric stack in the interconnect region 20 to reduce the aspect ratio (H/W) of the interconnects 200 as previously explained. This will be explained in more detail below. It should however be understood that the location of the etch stop layer 14 in the dielectric stack can be varied, i.e. the etch stop layer 14 does not necessarily have to be formed on top of the first dielectric layer 13 but may be formed on any suitable intermediate layer in the manufacturing process of the CMUT device 1. Moreover, the etch stop layer 14 may be omitted if a highly selective etching process can be provided that can terminate on a desired layer of the dielectric layer stack. For instance, one of the intermediate layers of the dielectric layer stack may be chosen such that it can act as an etch stop layer as well. It will be understood that in this scenario this intermediate layer must have a composition that is sufficiently different to its immediately overlaying layer of the dielectric layer stack to ensure that the etch recipe used to remove the layers of the dielectric layer stack over this intermediate layer does not affect this intermediate layer acting as etch stop layer.

Next, the second electrode 120 is formed on the first dielectric layer 13 as shown in step (e) such that the second electrode 120 is oriented opposite the first electrode 110. The second electrode 120 preferably is formed of the same electrically conductive material as the first electrode 110, although it should be understood that the second electrode 120 and the first electrode 110 alternatively may be formed of different materials. The second electrode 120 may for instance be formed from any suitable electrically conductive material such as Al, W, Cu, Ti, TiN and so on, as well as combinations of such materials. The second electrode 120 may be formed using well-known techniques that are not further explained for the sake of brevity only. The first electrode 110 and the second electrode 120 may be formed to any suitable thickness, e.g. 200-700 nm thickness.

After the formation of the second electrode 120, the method proceeds as shown in step (f), in which the second dielectric layer 15 is formed. In an optional embodiment, the second dielectric layer 15 is formed to a first thickness t1, which exceeds the thickness of the first portion 12 of the sacrificial material in between the first electrode 110 and the second electrode 120 such that upon formation of the cavity 130 the height g of the cavity gap is substantially smaller than the thickness t1, i.e. $g/t1 \ll 1$. Preferably $t1 \geq 5g$. This ensures that during the release of the cavity 130 in step (g), i.e. by formation of the access or via 16 and the subsequent removal of the first portion 12 and the second portion 12' of the sacrificial material, the membrane exhibits excellent membrane robustness during the cavity release step as $g \ll t1$ at the stage of removal of the sacrificial material to form the cavity 130. Moreover, because the second dielectric layer 15 is formed, e.g. deposited, prior to the release of the cavity 130, a membrane with excellent flatness characteristics is obtained as the presence of the sacrificial material prevents deformation of the first dielectric layer 13 during the formation of the second dielectric layer 15.

The first portion 12 and the second portions 12' of the sacrificial material are subsequently removed as shown in step (g) by the formation of the access or via 16 using a suitable etch recipe to form the cavity 130 in between the first electrode 110 and the second electrode 120 embedded in between the first dielectric layer 13 and the second dielectric layer 15 of the membrane 140 of the CMUT device. Suitable etch recipes for such conventional sacrificial materials are well-known per se and the skilled person will have no difficulty selecting an appropriate etch recipe using his common general knowledge.

The thickness of the dielectric layer stack including the membrane 140 is further increased during the sealing of the access or via 16 in step (h) by the formation of the further dielectric layer 17 including the plug 18 in the access or via 16. The further dielectric layer 17 may be substantially thinner than the second dielectric layer 15. The further dielectric layer 17 may be formed to a thickness of at least twice the height of the cavity 130 to effectively seal the access or via 16.

At this point it is emphasized that steps (a)-(h) schematically depict an advantageous but non-limiting example of forming one or more CMUT cells 100 on a substrate 30. Many alternative routes will be apparent to the skilled person. In particular, it is noted that the following steps are not specific to the embodiment depicted in steps (a)-(h) and may be applied to any CMUT manufacturing process in which a dielectric layer stack includes a CMUT region 10 in which the membranes 140 of the CMUT device 100 are defined and an interconnect region 20 covering the bond pads 200 of the CMUT device 1.

A notable process variation is that the access or via 16 may be sealed in any suitable manner using any suitable material, e.g. by depositing and patterning a dedicated sealing layer such as a metal layer to form the plug 18. It is furthermore noted that the cavity 130 may be released at any suitable point in the CMUT manufacturing process, e.g. prior to the formation of the second dielectric layer 15. Another notable process variation is that the first electrode 110 and/or the second electrode 120 may or may not be separated from the cavity 130 by a dielectric layer, as this is a typical design choice. As previously mentioned, a dielectric layer, i.e. an electrically insulating layer, may be provided over the first electrode 110 and/or the second electrode 120 to prevent direct contact between the first electrode 110 and the second electrode 120 during operation of the CMUT cell 100. The membrane 140 may be formed in any suitable manner, e.g. by a single dielectric layer rather than a stack of dielectric layers, and so on. Such process choices fall within the routine skills of the skilled person and will therefore not explicitly mentioned in detail for the sake of brevity only.

In step (i), a resist layer 19 is deposited over the dielectric stack and the region of the resist layer 19 over the interconnect region 20 is selectively developed through a mask 300 as indicated by the vertical arrows, and the developed resist is subsequently removed (not shown), e.g. using a suitable solvent to selectively expose the interconnect region 20 of the dielectric layer stack. The formation and development of such resist layers is well-known per se and many suitable resist materials will be apparent to the skilled person such that this will not be explained in further detail for the sake of brevity only. It is furthermore noted that although FIG. 5 schematically depicts the use of a positive resist, it is equally feasible to use a negative resist, in which case an inverse of the mask 300 may be used to expose the portion of the resist to be removed. It will furthermore be understood that instead of a resist layer 19, a hard mask may be deposited over the exposed surfaces of the device in progress and patterned to expose the interconnect region 20. Other suitable masking techniques will be apparent to the skilled person.

The thickness of the dielectric layer stack in the interconnect region 20 is reduced in step (j) by exposing the exposed interconnect region 20 of the dielectric layer stack to a suitable etch recipe (or a combination of suitable etch recipes in case of the dielectric layer stack being formed of different materials) and terminating the etch step at the desired depth, e.g. by terminating the etch step on the etch stop layer portion 14 as previously explained. As the etching of dielectric layers is well-known per se in the field of for instance semiconductor processing, this will not be explained in further detail for the sake of brevity only. It suffices to say that any suitable etch recipe may be used to selectively remove the desired portion of the dielectric stack in the interconnect region 20.

In step (k), the etch stop layer portion 14 may be removed if necessary, e.g. using a suitable etch recipe. Additionally or alternatively the resist layer 19 may be removed at this stage, e.g. using a suitable solvent. In case a hard mask is used instead of the resist layer 19, the hard mask may be removed at this stage using a suitable etch recipe, as is well-known per se. A further resist layer or hard mask layer 21 may be subsequently formed and patterned as previously explained for the resist layer 19 to expose a region 21' over the conductive contact 210 as shown in step (l).

Next, as shown in step (m) a trench 22 may be etched in the exposed portion of the recessed interconnect region 20. Depending on the location of the conductive contact 210, the formation of the trench 22 may include extending the trench 22 through the passivation stack 35 on the substrate 30, for instance in case of a bond pad 210 being formed in an upper layer of the metallization stack of the substrate 30 as previously explained. Alternatively, in a scenario in which the conductive contact 210 forms part of the metallization stack, a via (not shown) may previously have been formed through the passivation and/or planarization stack 35, in which case the trench 22 terminates on the passivation stack 35, thereby exposing the previously formed via. In some embodiments, the preformed via through the passivation (and/or planarization) stack 35 may be filled, e.g. lined, with a suitable conductive material, e.g. metal, in a process step in which the metal layer for the first electrode 110 is simultaneously deposited. Many more feasible process variations will be apparent to the skilled person.

The manufacturing process of the CMUT device 1 may subsequently be completed by filling the trench 22 with a suitable conductive material, e.g. a metal such as aluminium, a metal alloy such as an aluminium alloy, any of the metals or metal alloys previously mentioned in the context of the formation of the electrodes 110 and 120, and so on, to form the interconnect 200. To this end, as shown in step (n), the further resist layer or hard mask 21 (and any underlying resist and/or hard mask layers if still present) is removed as previously explained for the resist layer or hard mask 19, after which a metal layer 24 including the interconnect 200 is deposited over the resultant structure. As is shown in step (n), the trench 22 is lined by the metal layer 24 although it should be understood that in some embodiments the trench 22 may be (substantially) filled by the metal layer 24, e.g. by extending the duration of the metal deposition step.

Next, the metal layer 24 is patterned to remove the metal layer 24 from the regions in which the metal should not be present. To this end, a second further resist layer (or hard mask) 25 may be deposited over the metal layer 24 and subsequently patterned to protect the interconnect 200 from being removed. This is shown in step (o). The exposed portions of the metal layer 24 are subsequently removed, e.g. using a suitable etch recipe followed by the removal of the patterned second further resist layer (or hard mask) 25 to yield the device 1 including the interconnect 200 as shown in step (p). As previously explained, by reducing the thickness of the dielectric stack in the interconnect region 20 of the CMUT device 1, i.e. providing a recessed interconnect region 20, the interconnect 200 has a reduced height, i.e. a reduced aspect ratio, which facilitates the formation of high quality interconnects 200 and therefore improves the yield of the manufacturing process compared to manufacturing processes in which the interconnects 200 have to extend downwardly through a dielectric layer stack portion in the interconnect region 20 that has the same thickness as the dielectric layer stack portion in the CMUT region 10.

At this point it is noted that although not shown in the various embodiments, it should be understood that the CMUT devices 1 manufactured in accordance with embodiments may comprise additional circuit elements, which may be integrated on the substrate 30 or may be provided on a separate substrate and integrated into a single package with one or more of the CMUT devices from a wafer manufactured in accordance with embodiments of the present invention. Such additional circuitry may be instance be an IC, e.g. an ASIC, for controlling the one or more CMUT devices 1 and/or processing the signals generated by the one or more CMUT devices 1, e.g. to control transmission and/or reception modes of the one or more CMUT devices 1 as previously explained.

It is furthermore noted that in the aforementioned manufacturing process, a wafer processed during the manufacturing process may contain a single die, i.e. a single device, in which case the substrate 30 corresponds to the wafer, or a plurality of dies that may be singulated in any suitable manner, e.g. diced, after the completion of the device manufacturing process, in which case the substrate 30 corresponds to a part of the wafer. The interconnection region 20 may be peripheral to a substrate and/or to the wafer as a whole.

One or more CMUT devices 1 according to embodiments of the present invention may be advantageously incorporated into sensing apparatuses such as a pressure sensing apparatus and in particular in a medical imaging apparatus, e.g. an ultrasound imaging apparatus, where the integration of CMUT-based sensing elements can significantly improve the imaging resolution of the apparatus, which for instance improves the detectability of small size objects, e.g. anomalies such as tumours, in the body of a subject under investigation, e.g. a mammalian body such as a human body. In an embodiment, such an apparatus may comprise a CMUT device 1 according to embodiments of the present invention comprising a plurality of CMUT cells 100. Each of the CMUT cells 100 may be individually addressable. Alternatively, appropriate groups of CMUT cells 100, which together form an acoustic element, may be individually addressable at the group level. The CMUT cells 100 or groups of CMUT cells 100 may be arranged in a matrix. In a further embodiment, several CMUT devices 1, e.g. CMUT dies may be mounted, e.g. tiled, on a carrier, wherein the multiple CMUT devices 1 together define a large sensor area. Such an apparatus may for instance comprise several hundreds or thousands of (individually addressable) CMUT cells 100 distributed over one or more CMUT devices 1.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a device comprising a plurality of micro-machined ultrasonic transducer cells in a first region on a substrate and a plurality of interconnects in a second region on said substrate the method comprising:
   forming a dielectric layer stack over the substrate, said dielectric layer stack defining respective membranes of the micro-machined ultrasonic transducers in the first region;
   reducing the thickness of the dielectric layer stack in the second region by partially etching away the dielectric layer stack in the second region;
   etching a plurality of trenches in the reduced thickness portion of the dielectric layer stack, each of said trenches exposing a conductive contact in the second region; and
   at least lining said trenches with a conductive material.

2. The method of claim 1, wherein the step of reducing the thickness of the dielectric layer stack in the second region comprises depositing a resist layer over the dielectric layer stack, developing the resist layer through a lithographic mask and removing the resist from said second region.

3. The method of claim 1, wherein the step of reducing the thickness of the dielectric layer stack in the second region comprises depositing a hard mask over the dielectric layer stack and patterning the hard mask to expose the second region.

4. The method of claim 1, wherein:
   the step of forming a dielectric layer stack over the substrate (30) further includes forming an etch stop layer in said stack in the second region; and
   the step of partially etching away the dielectric layer stack in the second region comprises terminating said etching step on the etch stop layer.

5. The method of claim 4, further comprising removing the etch stop layer.

6. The method of claim 1, further comprising:
   forming a plurality of first electrodes in said first region on said substrate;
   forming a sacrificial material layer portion over each of the first electrodes;
   forming a first dielectric layer of the dielectric layer stack over the sacrificial material layer portions;
   forming a respective second electrode on the first dielectric layer over each of the sacrificial material layer portions;
   covering the resultant structure by at least one further dielectric layer of the dielectric layer stack;
   creating a plurality of openings in the first dielectric layer and the at least one further dielectric layer, each opening providing access to one of said sacrificial material portions;
   removing the sacrificial material portions through said openings; and forming at least a second further dielectric layer of the dielectric layer stack on the first dielectric layer, said second further dielectric layer sealing said openings.

7. The method of claim 6, wherein the step of forming said plurality of first electrodes comprises depositing a first metal layer on said substrate and patterning the first metal layer, said patterning step further comprising forming the conductive contacts in said second region.

8. The method of claim 6, wherein the step of forming said second electrodes comprises depositing a second metal layer on said first dielectric layer and patterning the second metal layer, said patterning step further comprising forming the conductive contacts in said second region.

9. The method of any of claim 1, wherein: the substrate carries at least one of a planarization stack and a passivation stack and wherein the conductive contacts are located below the planarization stack and/or passivation stack.

10. A device comprising a plurality of micro-machined ultrasonic transducer cells in a first region on a substrate, and a plurality of interconnects in a second region on said substrate for providing connections to respective conductive contacts on the substrate, the device further comprising a dielectric layer stack over said substrate defining the respective membranes of the micro-machined ultrasonic transducer cells in said first region, wherein the plurality of interconnects extend through said dielectric layer stack in said second region, a portion of said dielectric layer stack being removed from the second region such that the dielectric layer stack has a stepped profile in which said stack is recessed in said second region.

11. The device of claim 10, wherein said stack is recessed by at least 2 micron in said second region.

12. The device of claim 10, wherein the membranes each have a diameter of at least 100 micron and/or a thickness of at least 3 micron.

13. The device of claim 10, wherein the second region is a peripheral region of the device.

14. The device of any of claim 10, wherein each micro-machined ultrasonic transducer cell comprises a first electrode separated from a second electrode by a cavity, and wherein each second electrode is embedded in the membrane such that the second electrode is separated from the cavity by a first dielectric layer of said dielectric layer stack and the membrane further comprises at least one further dielectric layer of the dielectric layer stack on the second electrode, wherein the at least one further dielectric layer is thicker than the first dielectric layer.

15. An apparatus comprising the device of claim 10.

* * * * *